(12) United States Patent
Yang et al.

(10) Patent No.: US 10,784,820 B2
(45) Date of Patent: Sep. 22, 2020

(54) DUAL-OUTPUT AND DUAL-MODE SUPPLY MODULATOR, TWO-STAGE POWER AMPLIFIER USING THE SAME, AND SUPPLY MODULATION METHOD THEREFOR

(71) Applicant: Research & Business Foundation Sungkyunkwan University, Suwon-si (KR)

(72) Inventors: Younggoo Yang, Hwaseong-si (KR); Hansik Oh, Suwon-si (KR); Sungjae Oh, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/233,649

(22) Filed: Dec. 27, 2018

(65) Prior Publication Data

US 2019/0253023 A1   Aug. 15, 2019

(30) Foreign Application Priority Data

Feb. 9, 2018   (KR) .................. 10-2018-0016272

(51) Int. Cl.
| | | |
|---|---|---|
| *H03F 1/02* | (2006.01) | |
| *H03F 3/195* | (2006.01) | |
| *H03F 3/24* | (2006.01) | |

(52) U.S. Cl.
CPC ........... *H03F 1/0238* (2013.01); *H03F 3/195* (2013.01); *H03F 3/245* (2013.01);
(Continued)

(58) Field of Classification Search
CPC ..................................................... H03F 1/0238
(Continued)

(56) References Cited

U.S. PATENT DOCUMENTS

| | | | | |
|---|---|---|---|---|
| 8,942,652 B2 * | 1/2015 | Khlat | ...................... | H03G 1/00 330/200 |
| 2014/0062590 A1 * | 3/2014 | Khlat | ................... | H03G 3/3042 330/127 |

(Continued)

*Primary Examiner* — Patricia T Nguyen
(74) *Attorney, Agent, or Firm* — NSIP Law

(57) ABSTRACT

A dual-output and dual-mode supply modulator, a two-stage power amplifier using the same, and a supply modulation method therefor are provided. In order to improve the performance of a two-stage power amplifier used in a transmitter of a wireless communication system, the dual-output and dual-mode supply modulator according to the present invention may simultaneously supply an envelope tracking signal to a main amplification stage of the two-stage power amplifier and an average power tracking signal to an auxiliary amplification stage thereof. To this end, the dual-output and dual-mode supply modulator according to the present invention outputs two supply voltages and supports two operation modes. As such, it is possible to improve the efficiency of the two-stage power amplifier over a wide output power range with the use of a single supply modulator by employing envelope tracking on the main amplification stage and average power tracking on the auxiliary amplification stage in high output power regions or employing average power tracking both on the main amplification stage and auxiliary amplification stage in low output power regions.

16 Claims, 9 Drawing Sheets

(52) U.S. Cl.
CPC .. *H03F 2200/102* (2013.01); *H03F 2200/324* (2013.01); *H03F 2200/451* (2013.01)

(58) Field of Classification Search
USPC .......................................................... 330/10
See application file for complete search history.

(56) References Cited

U.S. PATENT DOCUMENTS

| | | | |
|---|---|---|---|
| 2014/0218109 A1* | 8/2014 | Wimpenny | H03F 3/217 330/251 |
| 2014/0361837 A1* | 12/2014 | Strange | H03F 1/0222 330/297 |
| 2016/0105151 A1* | 4/2016 | Langer | H03F 1/0227 330/295 |
| 2018/0152144 A1* | 5/2018 | Choo | H04B 1/0483 |
| 2018/0316311 A1* | 11/2018 | Gebeyehu | H04B 1/04 |
| 2019/0074769 A1* | 3/2019 | Youn | H02M 3/1582 |

* cited by examiner (a)

DUAL-OUTPUT AND DUAL-MODE SUPPLY MODULATOR, TWO-STAGE POWER AMPLIFIER USING THE SAME, AND SUPPLY MODULATION METHOD THEREFOR

CROSS REFERENCE TO RELATED APPLICATION

This application claims the benefit under 35 USC 119(a) of Korean Patent Application No. 10-2018-0016272 filed on Feb. 9, 2018 in the Korean Intellectual Property Office, the entire disclosure of which is incorporated herein by reference for all purposes.

BACKGROUND OF THE INVENTION

Field of the Invention

The present invention relates to a dual-output and dual-mode supply modulator, and more particularly, to a dual-output and dual-mode supply modulator, a two-stage power amplifier using the same, and a supply modulation method therefor.

Related Art

Modern wireless communication systems use modulation techniques with a high peak to average power ratio (PAPR) in order to process large amounts of data. To linearly amplify high PAPR modulated signals, a power amplifier usually operates not in a maximum output region, but in a back-off region. In this case, the efficiency of the power amplifier is much lower compared to when it operates in the maximum output region.

Generally, there are power amplification techniques proposed to improve the efficiency of the power amplifier operating in the back-off region and lower power regions, including envelope tracking (ET), in which the level of the voltage supplied to the power amplifier is modulated to follow the envelope of radio input signal, and average power tracking (APT), in which, when the power amplifier is at a low output level, the supply voltage for the power amplifier is lowered to reduce power consumption.

Envelope tracking is advantageous in that, with the use of a supply modulator having a simple structure, the efficiency of the power amplifier can be improved with no degradation in linearity. Average power tracking, too, can improve the efficiency of the power amplifier in low power regions simply by using a DC/DC converter. Both of the two approaches are widely used in mobile transmitters since they can improve the efficiency of the power amplifier through a supply modulator that features a relatively simple structure.

Power amplifiers for mobile transmitters are generally designed to have two stages because they require high gain. In this case, an auxiliary amplification stage has much lower efficiency than a main amplification stage because it requires high gain and high linearity. Because of its lower efficiency, the auxiliary amplification stage lowers the efficiency of the two-stage power amplifier, resulting in a decrease in the efficiency of the overall transmission system.

Moreover, when it is desired to improve the efficiency of the main amplification stage with the use of a traditional envelope tracking supply modulator, a DC/DC converter needs to be added to provide a stable power supply to the auxiliary amplification stage. This increases the size of the transmitter circuit and makes the supply circuit more complex.

Referring to FIG. 1, a two-stage power amplifier 10 according to an example of the conventional art includes a main amplification stage 14, an auxiliary amplification stage 12, and envelope tracking supply modulator 11 (including 16 to 26 and L1). This supply modulator 11 has a single output voltage $V_{MAIN}$ which is outputted to the main amplification stage 14, and improves the efficiency of the main amplification stage 14 by applying a modulated supply signal to the main amplification stage 14. Power is supplied using a DC/DC converter 16 in order to supply a stable fixed voltage $V_{DRV}$ to the auxiliary amplification stage 12. In this case, the efficiency of the main amplification stage 14 is improved, but the efficiency of the auxiliary amplification stage 12 is not improved, and the addition of the DC/DC converter 16 increases the overall circuit size of the supply modulator 16 to 26.

RELATED DOCUMENTS

Patent Documents

Korean Registered Patent Publication No. 10-1664718 (published on Oct. 12, 2016)

Korean Registered Patent Publication No. 10-1467231 (published on Dec. 1, 2014)

Korean Registered Patent Publication No. 10-1350731 (published on Jan. 13, 2014)

SUMMARY OF THE INVENTION

The present invention provides a dual-output and dual-mode supply modulator, and more particularly, to a dual-output and dual-mode supply modulator, a two-stage power amplifier using the same, and a supply modulation method therefor.

A first aspect of the present invention is to provide a supply modulator for improving the system efficiency of the two-stage power amplifier used in a transmitter of a wireless communication system.

A second aspect of the present invention is to improve the efficiency of the two-stage power amplifier with the use of a single supply modulator by outputting two supply voltages and switching between two modes.

A third aspect of the present invention is to simplify the circuit configuration of the supply modulator and improve the efficiency of the power amplifier over a wide output power range.

A fourth aspect of the present invention is to propose a supply modulation method for a two-stage power amplifier that can improve the efficiency of the two-stage power amplifier over a wide output power range with the use of a single supply modulator by employing envelope tracking on a main amplification stage and average power tracking on an auxiliary amplification stage in high output power regions or employing average power tracking both on the main amplification stage and auxiliary amplification stage in low output power regions.

Technical problems to be solved by the present invention are not limited to the above-mentioned technical problems, and other technical problems not mentioned herein may be clearly understood by those skilled in the art from description below.

To accomplish the above aspects, the present invention provides a dual-output and dual-mode supply modulator which simultaneously supplies an envelope tracking signal to a main amplification stage of a two-stage power amplifier and an average power tracking signal to an auxiliary amplification stage thereof. This dual-output and dual-mode supply modulator may improve the efficiency of the two-stage power amplifier used in a transmitter of a wireless communication system.

An exemplary embodiment of the present invention provides a dual-output and dual-mode supply modulator comprising: a dual-output and dual-mode control circuit that receives first to fourth reference voltages and a mode signal for selecting either a first or second mode and outputs one envelope tracking signal and one average power tracking signal in the first mode and outputs two average power tracking signals in the second mode; a switching amplification stage that is controlled by the dual-output and dual mode control circuit to regulate the amounts of current in the envelope tracking signal and average power tracking signal outputted in the first or second mode; a linear amplification stage that receives the first reference voltage and supplies more current to the envelope tracking signal so that an output voltage of the envelope tracking signal tracks the first reference voltage in the first mode; and a switching circuit that is controlled by the dual-output and dual-mode control circuit and performs switching to output one envelope tracking signal and one average power tracking signal in the first mode or performs switching to output two average power tracking signals in the second mode.

The dual-output and dual-mode control circuit comprises: a first mode control block that outputs a first mode control signal to allow the supply modulator to operate in the first mode; a second mode control block that outputs a second mode control signal to allow the supply modulator to operate in the second mode; and a mode selection block that selectively outputs the first or second mode control signal in response to the mode signal.

The switching circuit comprises first and second switching elements, wherein the first switching element performs switching to output one average power tracking signal in the first mode and output another average power tracking signal in the second mode, and the second switching element performs switching to output one envelope tracking signal in the first mode and output yet another average power tracking signal in the second mode.

The supply modulator operates in the first mode in a first output power region of a two-stage power amplifier comprising a main amplification stage and an auxiliary amplification stage to supply one envelope tracking signal to the main amplification stage and one average power tracking signal to the auxiliary amplification stage, and the supply modulator operates in the second mode in a second output power region of the two-stage power amplifier which is lower than the first output power region to supply two average power tracking signals respectively to the main amplification stage and the auxiliary amplification stage.

Another exemplary embodiment of the present invention provides a two-stage power amplifier using a dual-output and dual-mode supply modulator, the two-stage power amplifier comprising: a main amplification stage provided between input and output; an auxiliary amplification stage provided between the input and the main amplification stage and connected in series to the main amplification stage; and the dual-output and dual-mode supply modulator that operates in the first or second mode in response to a plurality of reference voltages and a mode signal for selecting an operation mode, and that outputs an envelope tracking signal to the main amplification stage and an average power tracking signal to the auxiliary amplification stage in the first mode and outputs two average power tracking signals respectively to the main amplification stage and the auxiliary amplification stage.

The dual-output and dual-mode supply modulator comprises: a dual-output and dual-mode control circuit that receives first to fourth reference voltages and a mode signal for selecting either the first or second mode and that, in the first mode, supplies a first output voltage to the main amplification stage by an envelope tracking signal and a second output voltage to the auxiliary amplification stage by an average power tracking signal and, in the second mode, supplies the first and second output voltages respectively to the main amplification stage and the auxiliary amplification stage by two average power tracking signals; a switching amplification stage that is controlled by the dual-output and dual mode control circuit to regulate the amounts of current supplied respectively to the main amplification stage and auxiliary amplification stage; a linear amplification stage that receives the first reference voltage and supplies current to the main amplification stage so that the first output voltage supplied to the main amplification stage tracks the first reference voltage; and a switching circuit that is controlled by the dual-output and dual-mode control circuit and performs switching to supply the first output voltage to the main amplification stage and supply the second output voltage to the auxiliary amplification stage.

The dual-output and dual-mode control circuit comprises: a first mode control block that receives the first and second reference voltages and the fourth reference voltage and outputs a first mode control signal to allow the supply modulator to operate in the first mode; a second mode control block that receives the third and fourth reference voltages and outputs a second mode control signal to allow the supply modulator to operate in the second mode; and a mode selection block that selectively outputs the first or second mode control signal in response to the mode signal.

The switching amplification stage comprises first and second switching elements, and is controlled by the dual-output and dual-mode control circuit in such a way as to receive an output voltage of low level and switch on the first switching element and switch off the second switching element to increase the amount of current supply, or in such a way as to receive an output voltage of high level and switch off the first switching element and switch on the second switching element to decrease the amount of current supply.

The switching circuit comprises third and fourth switching elements, wherein the third switching element performs switching to supply or cut off the current from the switching amplification stage to the auxiliary amplification stage, and the fourth switching element performs switching to supply or cut off the current from the switching amplification stage to the main amplification stage.

The linear amplification stage operates in the first mode to supply current to the main amplification stage so that the first output voltage tracks the first reference voltage.

The supply modulator further comprises a transmission gate switch that disconnects the first output voltage from the main amplification stage in the first mode as the linear amplification stage turns on and connects the first output voltage to the main amplification stage in the second mode as the linear amplification stage turns off.

The supply modulator operates in the first mode in a first output power region of the two-stage power amplifier to supply one envelope tracking signal to the main amplification stage and one average power tracking signal to the auxiliary amplification stage, and the supply modulator operates in the second mode in a second output power region of the two-stage power amplifier which is lower than the first output power region to supply two average power tracking signals respectively to the main amplification stage and the auxiliary amplification stage.

A further exemplary embodiment of the present invention provides a supply modulation method for a two-stage power amplifier using a dual-output and dual-mode supply modulator, the method comprising: receiving first to fourth reference voltages and a mode signal that allows a supply modulator of the two-stage power amplifier to operate in a first mode if the two-stage power amplifier operates in a first output power region and allows the supply modulator to operate in a second mode if the two-stage power amplifier operates in a second output power region which is lower than the first output power region; when the supply modulator operates in the first mode, comparing the first reference voltage and the second reference voltage, and, if the first reference voltage is in a higher region than the second reference voltage, turning on a first transistor of a switching amplification stage of the supply modulator to increase the amount of current supply and turning on a fourth transistor of a switching circuit of the supply modulator to supply current to the main amplification stage; if the first reference voltage is in a lower region than the second reference voltage, comparing the second output voltage and the fourth reference voltage, and, if the second output voltage is in a lower region than the fourth reference voltage, turning on the first transistor of the switching amplification stage to increase the amount of current supply and turning on a third transistor of the switching circuit to supply current to the auxiliary amplification stage; and if the second output voltage is in a higher region than the fourth reference voltage, turning on a second transistor of the switching amplification stage to decrease the amount of current supply and turning on the fourth transistor of the switching circuit to supply current to the main amplification stage.

The supply modulation method further comprises: when the supply modulator operates in the second mode, comparing the second output voltage and the fourth reference voltage, and, if the second output voltage is in a higher region than the fourth reference voltage, turning on the first transistor of the switching amplification stage to increase the amount of current supply and turning on the third transistor of the switching circuit to supply current to the auxiliary amplification stage; and if the second output voltage is in a lower region than the fourth reference voltage, comparing the first output voltage and the third reference voltage, and, if the first output voltage is in a lower region than the third reference voltage, turning on the first transistor of the switching amplification stage to increase the amount of current supply and turning on the fourth transistor of the switching circuit to supply current to the main amplification stage.

The supply modulation method further comprises: if the first output voltage is in a higher region than the third reference voltage, turning on the second transistor of the switching amplification stage to decrease the amount of current supply and turning on the fourth transistor of the switching circuit to supply remaining current to the main amplification stage.

In the supply modulation method, in the first output power region of the two-stage power amplifier, the supply modulator operates in the first mode to supply one envelope tracking signal to the main amplification stage and one average power tracking signal to the auxiliary amplification stage, and, in the second output power region, the supply modulator operates in the second mode to supply two average power tracking signals respectively to the main amplification stage and the auxiliary amplification stage.

A dual-output and dual-mode supply modulator, a two-stage power amplifier using the same, and a supply modulation method therefor according to the present invention have the following advantages.

First, the present invention may improve the efficiency of the two-stage power amplifier with the use of a single supply modulator by outputting two supply voltages and supporting two modes for power supply to the two-stage power amplifier.

Second, the present invention may simplify the circuit configuration of the supply modulator and improve the efficiency of the power amplifier over a wide output power range.

Third, the present invention may improve the efficiency of the two-stage power amplifier in a wireless communication system with the use of a supply modulator.

The advantageous effects of the present invention are not limited to the above-mentioned ones, and other advantageous effects not mentioned herein may be clearly understood by those skilled in the art from description below.

DESCRIPTION OF EXEMPLARY EMBODIMENTS

Figure 1:
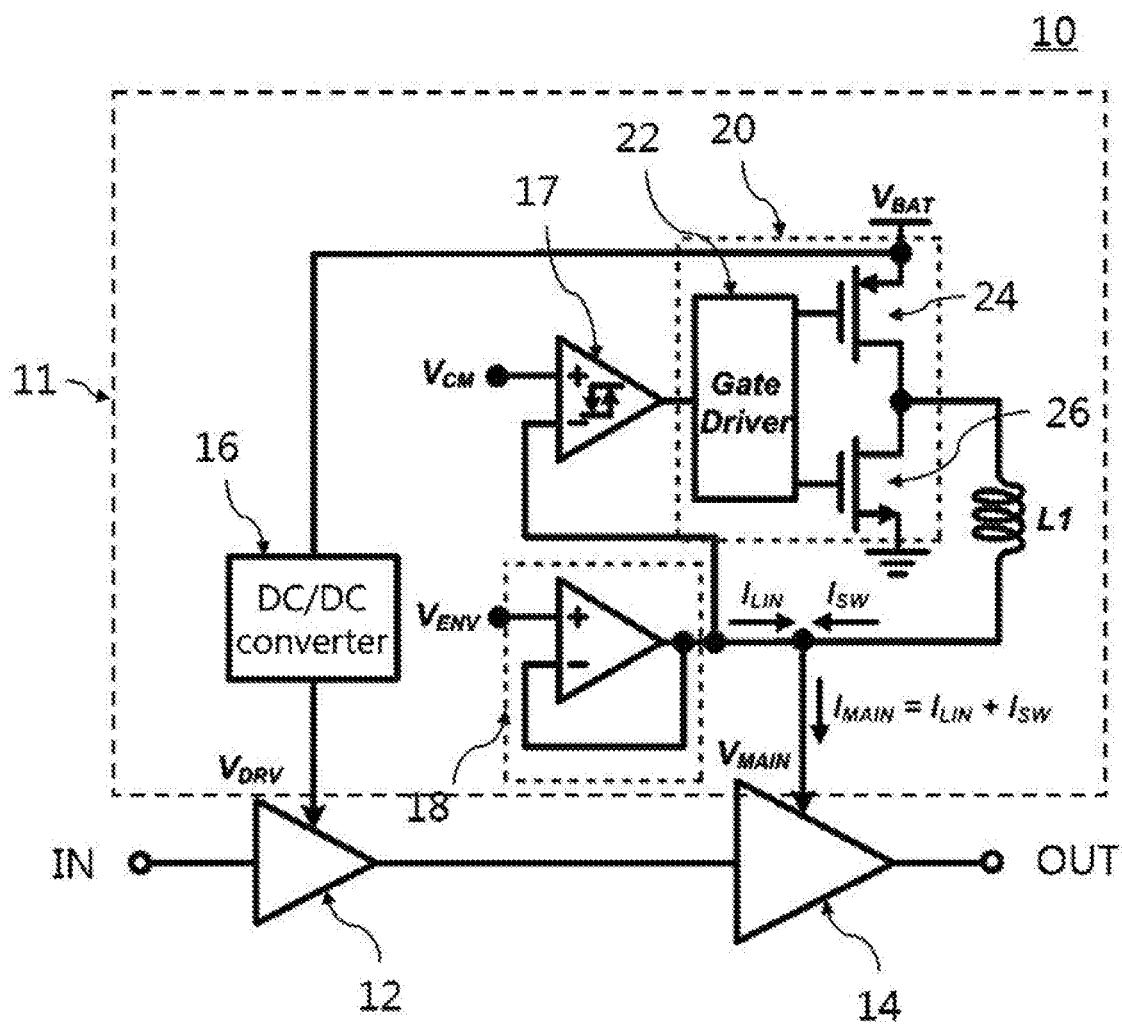
FIG. 1 is a circuit diagram showing a construction of a two-stage power amplifier having an envelope tracking supply modulator according to an example of the conventional art.

Hereinafter, embodiments of the present invention will be described with reference to the accompanying drawings such that those skilled in the art to which the present invention pertains may easily implement the present invention. As easily understood by those skilled in the art to which the present invention pertains, the embodiments which will be described below may be modified in various forms without departing from the concept and scope of the present invention. Whenever possible, like or similar reference numerals are used throughout the drawings to refer to like or similar parts.

The terminology used herein is for the purpose of describing particular embodiments only and is not intended to limit the present inventive concept. As used herein, the singular forms "a," "an," and "the," are intended to include the plural forms as well, unless the context clearly indicates otherwise.

It will be further understood that the terms "comprises" and/or "comprising," or "includes" and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to improve the performance of a two-stage power amplifier used in a transmitter of a wireless communication system, a dual-output and dual-mode supply modulator according to the present invention may simultaneously supply an envelope tracking signal to a main amplification stage of the two-stage power amplifier and an average power tracking signal to an auxiliary amplification stage thereof.

To this end, the dual-output and dual-mode supply modulator according to the present invention outputs two supply voltages and supports two operation modes. As such, it is possible to improve the efficiency of the two-stage power amplifier over a wide output power range with the use of a single supply modulator by employing envelope tracking on the main amplification stage and average power tracking on the auxiliary amplification stage in high output power regions or employing average power tracking both on the main amplification stage and auxiliary amplification stage in low output power regions.

This dual-output and dual-mode supply modulator according to the present invention improves the two-stage power amplifier in high power regions by modulating the supply to the main amplification stage by envelope tracking and modulating the supply to the auxiliary amplification stage by average power tracking. However, in low power regions, the output supply voltage modulated by the supply modulator is low due to the small size of the envelope, which decreases the efficiency of the supply modulator. Accordingly, in low power regions, the mode is changed to modulate the supply by employing average power tracking on both the main amplification stage and the auxiliary amplification stage. With this, the efficiency of the two-stage power amplifier is expected to be further improved over a wide power range.

Hereinafter, the present invention will be described in details with reference to the drawings.

Figure 2:
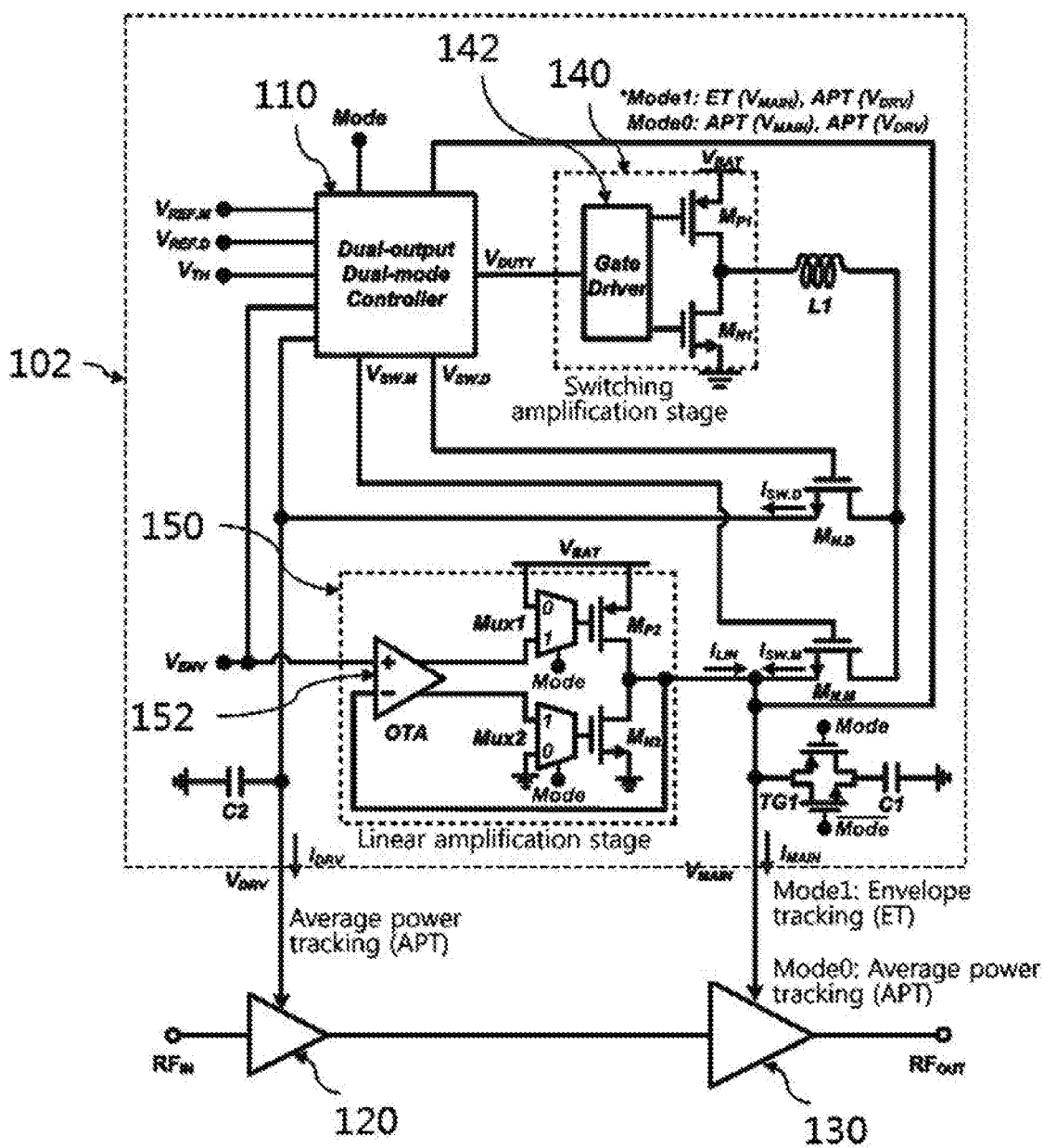
FIG. 2 is a circuit diagram showing a construction of a two-stage power amplifier having a dual-output and dual-mode supply modulator according to an exemplary embodiment of the present invention.
Figure 3:
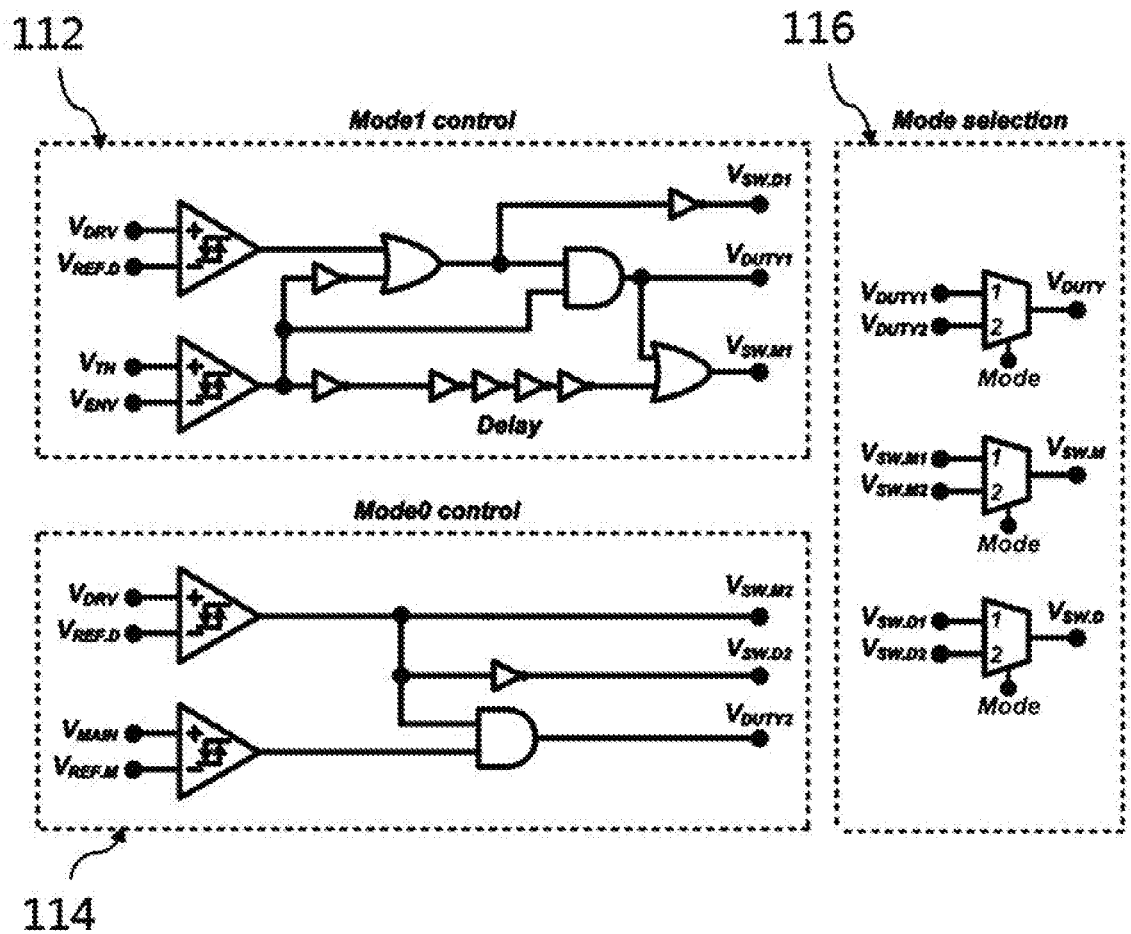
FIG. 3 is a circuit diagram showing an operational configuration of the dual-output and dual-mode control circuit shown in FIG. 2.

FIG. 2 is a circuit diagram showing a construction of a two-stage power amplifier having a dual-output and dual-mode supply modulator according to an exemplary embodiment of the present invention. FIG. 3 is a circuit diagram showing an operational configuration of the dual-output and dual-mode control circuit shown in FIG. 2.

Referring to FIGS. 2 and 3, the two-stage power amplifier 100 according to the present invention is used in a transmitter of a wireless communication system, and includes a dual-output and dual-mode supply modulator 102 for performance improvement.

That is, the two-stage power amplifier 100 according to the present invention includes a main amplification stage 130, an auxiliary amplification stage 120, and a supply modulator 102.

The supply modulator 102 provides two modes Mode1 and Mode2 to supply two output voltages $V_{MAIN}$ and $V_{DRV}$. In the first mode Mode1 (ET/APT), one envelope tracking (ET) voltage and one average power tracking (APT) voltage are provided. The envelope tracking (ET) voltage is applied to the main amplification stage 130 to improve efficiency, and the average power tracking (APT) voltage is supplied to the auxiliary amplification stage 120 to improve efficiency. In the second mode Mode0 (APT/APT), two average power tracking (APT) voltages are provided. The two average power tracking (APT) voltages are respectively applied to the main amplification stage 130 and the auxiliary amplification stage 120 to improve efficiency.

Accordingly, the present invention may improve both the efficiency of the main amplification stage 130 and the efficiency of the auxiliary amplification stage 120 with the use of a single supply modulator 102. Moreover, the circuit becomes smaller and less complex compared to the conventional art, since there is no need to add a DC/DC inverter to the auxiliary amplification stage 120.

Specifically, the supply modulator 102 includes a dual-output and dual-mode control circuit 110, a switching amplification stage 140, a linear amplification stage 150, a switching circuit $M_{N,D}$ and $M_{N,M}$, and peripheral circuits L1, TG1, C1, and C2. The switching amplification stage 140 includes a gate driver 142 and a plurality of transistors $M_{P1}$ and $M_{N1}$. The linear amplification stage 150 includes an operational transconductance amplifier (OTA) 152, a plurality of multiplexers MUX1 and MUX2, and a plurality of transistors $M_{P2}$ and $M_{N2}$. The switching circuit $M_{N,D}$ and $M_{N,M}$ includes a plurality of transistors. The transistors $M_{P1}$, $M_{N1}$, $M_{P2}$, $M_{N2}$, $M_{N,D}$, and $M_{N,M}$ are provided as switching elements.

The dual-output and dual-mode control circuit 110 receives a plurality of reference voltages $V_{TH}$, $V_{REF.M}$, $V_{REF.D}$, and $V_{ENV}$ and a mode signal Mode from the outside (for example, a transmitter of a wireless power system that uses a two-stage power amplifier; not shown) and controls the circuits in the supply modulator 102 in response to the received mode signal Mode to determine the forms of two outputs provided to the main amplification stage 130 and auxiliary amplification stage 120.

Here, the first reference voltage $V_{ENV}$ is a voltage for detecting the envelope of an RF input signal $RF_{IN}$ of the two-stage power amplifier 100 and at the same time a reference voltage for determining the first output voltage $V_{MAIN}$ provided to the main amplification stage 130 in the first mode Mode1. The second reference voltage $V_{TH}$ is a reference voltage for determining whether to supply the current in the switching amplification stage 140 to the main amplification stage 130 or to the auxiliary amplification stage 120 in the first mode Mode1. The third reference voltage $V_{REF.M}$ is a reference voltage for determining the first output voltage $V_{MAIN}$ in the second mode Mode0, and the fourth reference voltage $V_{REF.D}$ is a reference voltage for determining the second output voltage $V_{DRV}$ in the first mode Mode1 or second mode Mode0. The supply voltage $V_{BAT}$ is a battery voltage that is supplied from a battery (not shown) to the supply modulator 102.

The mode signal Mode determines the form of output of the supply modulator 102 according to the output level of the two-stage power amplifier 100. That is, when the first mode Mode1 is selected by the mode signal Mode, an envelope tracking (ET) voltage and an average power tracking (APT) voltage are respectively supplied to the main amplification stage 130 and the auxiliary amplification stage 120 so that the two-stage power amplifier 100 operates in a high power region. When the second mode Mode0 is selected by the mode signal Mode, average power tracking (APT) voltages are respectively supplied to the main amplification stage 130 and the auxiliary amplification stage 120 so that the two-stage power amplifier 100 operates in a low power region.

Moreover, the dual-output and dual-mode control circuit 110 regulates the currents $I_{MAIN}$ and $I_{DRV}$ respectively needed for the main amplification stage 130 and auxiliary amplification stage 120 by adjusting third to fifth output voltages $V_{DUTY}$, $V_{SW.D}$, and $V_{SW.M}$. Here, when the third output voltage $V_{DUTY}$ is at low level, the first transistor $M_{P1}$ of the switching amplification stage 140 turns on and the second transistor $M_{N1}$ turns off to increase the amount of current supplied to the switching amplification stage 140, and when the third output voltage $V_{DUTY}$ is at high level, the first transistor $M_{P1}$ of the switching amplification stage 140 turns off and the second transistor $M_{N1}$ turns on to decrease the amount of current supplied to the switching amplification stage 140. The fourth output voltage $V_{SW.D}$ causes the current $I_{SW.D}$ from the switching amplification stage 140 to be supplied to or cut off from the auxiliary amplification stage 120 by turning on or off the third transistor $M_{N.D}$. The fifth output voltage $V_{SW.M}$ causes the current $I_{SW.M}$ from the switching amplification stage 140 to be supplied to or cut off from the main amplification stage 130 by turning on or off the fourth transistor $M_{N.M}$.

To this end, the dual-output and dual-mode control circuit 110 includes first and second mode control blocks 112 and 114 and a mode selection block 116, as shown in FIG. 3.

The first mode control block 112 generates reference voltages $V_{DUTY1}$, $V_{SW.D1}$, and $V_{SW.M1}$ in the first mode Mode1 to regulate the operations of the transistors $M_{P1}$, $M_{N1}$, $M_{N.D}$, and $M_{N.M}$, and the second mode control block 114 generates reference voltages $V_{DUTY2}$, $V_{SW.D2}$, and $V_{SW.M2}$ in the second mode Mode0 to regulate the operations of the transistors $M_{P2}$, $M_{N2}$, $M_{N.D}$, and $M_{N.M}$. The reference voltage signals $V_{DUTY1}$, $V_{SW.D1}$, $V_{SW.M1}$, $V_{DUTY2}$, $V_{SW.D2}$, and $V_{SW.M2}$ act as mode control signals. The mode selection block 116 selects whether to pass signals outputted from the first and second mode control block 112 and 114 or not, in response to mode control signals outputted from the first and second mode control blocks 112 and 114.

Thus, in the first mode Mode1, the linear amplification stage 150 turns on and the transmission gate switch TG1 turns off to disconnect the capacitor C1 from the first output voltage $V_{MAIN}$. In this case, the switching amplification stage 140 supplies the currents $I_{SW.D}$ and $I_{SW.M}$ to the main amplification stage 130 and the auxiliary amplification stage 120, and adjusts the amounts of current $I_{SW.D}$ and $I_{SW.M}$ supplied to them by regulating the third to fifth output voltages $V_{DUTY}$, $V_{SW.D}$, and $V_{SW.M}$. Moreover, the linear amplification stage 150 supplies current $I_{LIN}$ to the main amplification stage 130 so that the first output voltage $V_{MAIN}$ tracks the first reference voltage $V_{ENV}$. Therefore, the second output voltage $V_{DRV}$ is regulated to be the same as the fourth reference voltage $V_{REF.D}$, and the first output voltage $V_{MAIN}$ is regulated to be the same as the first reference voltage $V_{ENV}$.

In the second mode Mode0, the linear amplification stage 150 turns off and the transmission gate switch TG1 turns on to connect the capacitor C1 to the first output voltage $V_{MAIN}$. In this case, the dual-output and dual-mode control circuit 110 supplies the currents $I_{SW.D}$ and $I_{SW.M}$ respectively needed for the main amplification stage 130 and auxiliary amplification stage 120 by adjusting the third to fifth output voltages $V_{DUTY}$, $V_{SW.D}$, and $V_{SW.M}$. Therefore, the second output voltage $V_{DRV}$ is regulated to be the same as the fourth reference voltage $V_{REF.D}$, and the first output voltage $V_{MAIN}$ is regulated to be the same as the third reference voltage $V_{REF.M}$.

Here, the second output voltage $V_{DRV}$ is the average power tracking (APT) voltage of the auxiliary amplification stage 120 which is determined by the fourth reference voltage $V_{REF.D}$, and the first output voltage $V_{MAIN}$ is the envelope tracking (ET) voltage of the main amplification stage 130 which is determined by the first reference voltage $V_{ENV}$ for operation in the first mode Mode1 or the average power tracking (APT) voltage of the main amplification stage 130 which is determined by the fourth reference voltage $V_{REF.D}$ for operation in the second mode Mode0.

Figure 4:
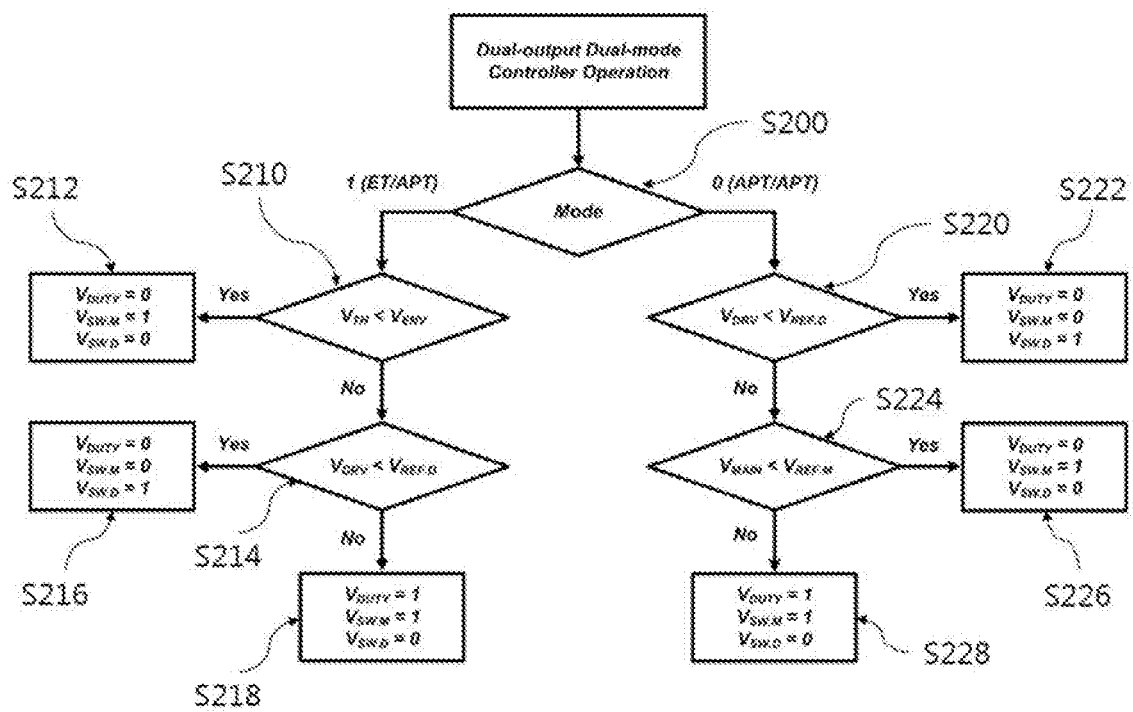
FIG. 4 is a flowchart showing an operational sequence of the two-stage power amplifier having the dual-output and dual-mode supply modulator according to the present invention.

FIG. 4 is a flowchart showing an operational sequence of the two-stage power amplifier having the dual-output and dual-mode supply modulator according to the present invention. This sequence is a program controlled by the dual-output and dual-mode control circuit 110, which is stored in an internal memory (not shown) of the dual-output and dual-mode control circuit 110.

Referring to FIG. 4, in the step S200, if the two-stage power amplifier 100 of the present invention operates in a high power region, then a mode signal Mode of high level 1 is inputted into the dual-output and dual-mode control circuit 110 of the supply modulator 102, and if the two-stage power amplifier 100 operates in a low power region, then a mode signal Mode of low level 0 is inputted into the dual-output and dual-mode control circuit 110. Hereupon, the supply modulator 102 is controlled by the dual-output and dual-mode control circuit 110 to operate in the first mode Mode1 by the mode signal Mode of high level 1 or operate in the second mode Mode0 by the mode signal Mode of low level 0.

That is, when the supply modulator 102 operates in the first mode Mode1, the dual-output and dual-mode control circuit 110 compares the first reference voltage $V_{ENV}$ and the second reference voltage $V_{TH}$ in the step S210. If the first reference voltage $V_{ENV}$ is in a higher region than the second reference voltage $V_{TH}$, then the dual-output and dual-mode control circuit 110 turns on the first transistor $M_{P1}$ of the switching amplification stage 140 to increase the amount of current supply and turns on the fourth transistor $M_{N.M}$ to supply current to the main amplification stage 130 in the step S212 ($V_{DUTY}=0$, $V_{SW.M}=1$, $V_{SW.D}=0$).

If the first reference voltage $V_{ENV}$ is in a lower region than the second reference voltage $V_{TH}$, then the dual-output and dual-mode control circuit 110 compares the second output voltage $V_{DRV}$ and the fourth reference voltage $V_{REF.D}$ in the step S214. If the auxiliary amplification stage 120 requires current supply—that is, the second output voltage $V_{DRV}$ is in a lower region than the fourth reference voltage $V_{REF.D}$, then the dual-output and dual-mode control circuit 110 proceeds to the step S216 and turns on the first transistor $M_{P1}$ of the switching amplification stage 140 to increase the amount of current supply and turns on the third transistor $M_{N.D}$ to supply current to the auxiliary amplification stage 120 ($V_{DUTY}=0$, $V_{SW.M}=0$, $V_{SW.D}=1$). On the other hand, if the auxiliary amplification stage 120 requires no current supply ($V_{DRV}>V_{REF.D}$) in the step S214, then the dual-output and dual-mode control circuit 110 proceeds to the step S218 and turns on the second transistor $M_{N1}$ of the switching amplification stage 140 to decrease the amount of current supply and turns on the fourth transistor $M_{N.M}$ to supply current to the main amplification stage 130 ($V_{DUTY}$=1, $V_{SW.M}$=1, $V_{SW.D}$=0).

When the supply modulator 102 operates in the second mode Mode1, the dual-output and dual-mode control circuit 110 compares the second output voltage $V_{DRV}$ and the fourth reference voltage $V_{REF.D}$ in the step S220. If the second output voltage $V_{DRV}$ is in a higher region than the fourth reference voltage $V_{REF.D}$—the auxiliary amplification stage 120 requires current supply ($V_{DRV}$<$V_{REF.D}$), then the dual-output and dual-mode control circuit 110 turns on the first transistor $M_{P1}$ of the switching amplification stage 140 to increase the amount of current supply and turns on the third transistor $M_{N.D}$ to supply current to the auxiliary amplification stage 120 in the step S222 ($V_{DUTY}$=0, $V_{SW.M}$=0, $V_{SW.D}$=1).

If the comparison of the second output voltage $V_{DRV}$ and the fourth reference voltage $V_{REF.D}$ shows that the second output voltage $V_{DRV}$ is in a lower region than the fourth reference voltage $V_{REF.D}$—that is, the auxiliary amplification stage 120 requires no current supply ($V_{DRV}$>$V_{REF.D}$), then the dual-output and dual-mode control circuit 110 compares the first output voltage $V_{MAIN}$ and the third reference voltage $V_{REF.M}$ in the step S224. If the first output voltage $V_{MAIN}$ is in a lower region than the third reference voltage $V_{REF.M}$—that is, the main amplification stage 130 requires current supply ($V_{MAIN}$<$V_{REF.D}$), then the dual-output and dual-mode control circuit 110 proceeds to the step S226 and turns on the first transistor $M_{P1}$ of the switching amplification stage 140 to increase the amount of current supply and turns on the fourth transistor $M_{N.M}$ to supply current to the main amplification stage 130 ($V_{DUTY}$=0, $V_{SW.M}$=1, $V_{SW.D}$=0).

However, if the first output voltage $V_{MAIN}$ is in a higher region than the third reference voltage $V_{REF.M}$ in the step S224—that is, both the main amplification stage 130 and the auxiliary amplification stage 120 require no current supply ($V_{DRV}$>$V_{REF.D}$ and $V_{MAIN}$>$V_{REF.M}$), then the dual-output and dual-mode control circuit 110 proceeds to the step S228 and turns on the second transistor $M_{N1}$ of the switching amplification stage 140 to decrease the amount of current supply and turns on the fourth transistor $M_{N.M}$ to supply remaining current to the main amplification stage 130 ($V_{DUTY}$=1, $V_{SW.M}$=1, $V_{SW.D}$=0).

Figure 5:
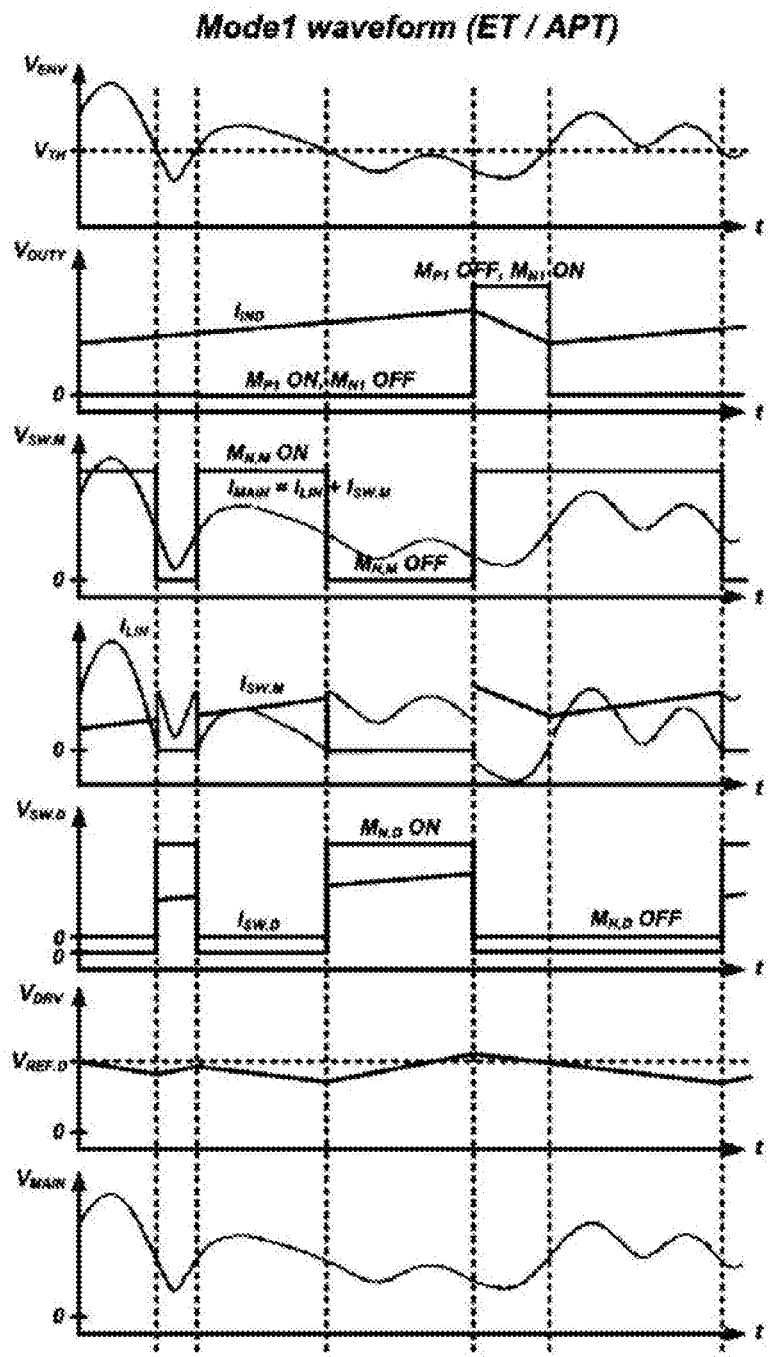
FIGS. 5 and 6 are waveform diagrams showing operating states of first and second modes shown in FIG. 2.
Figure 6:
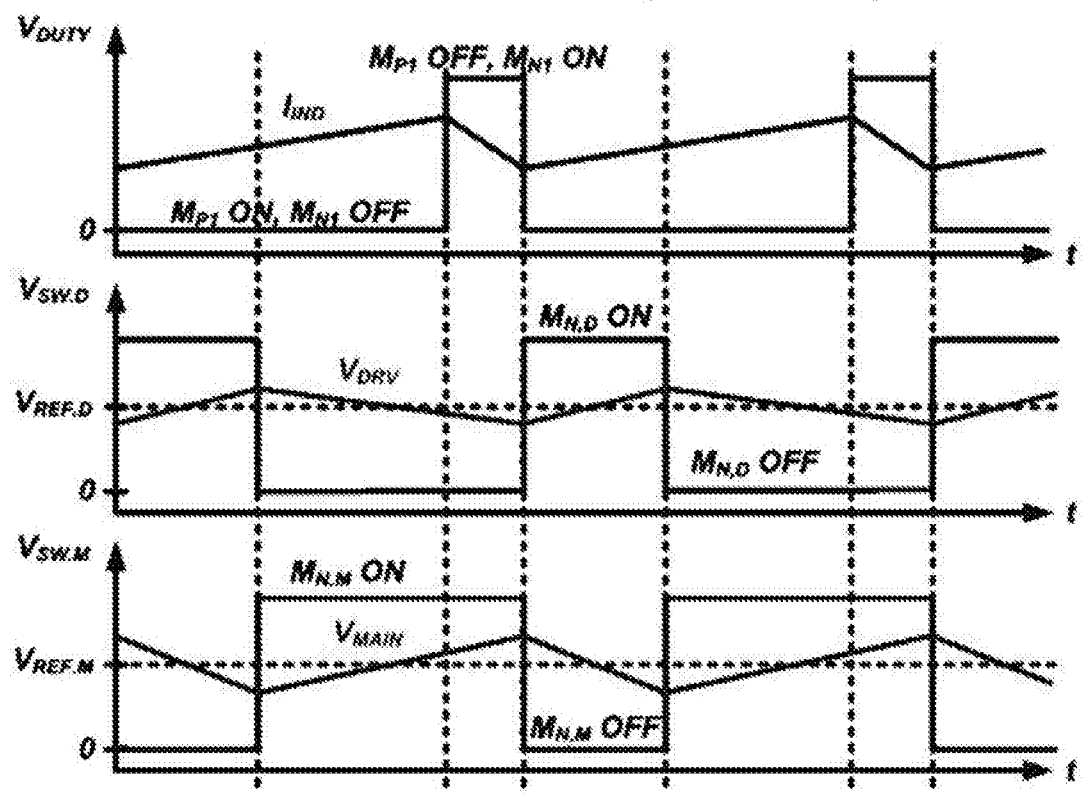

FIGS. 5 and 6 are waveform diagrams showing operating states of first and second modes shown in FIG. 2.

Referring to FIGS. 5 and 6, the supply modulator 102 of the present invention is controlled by the dual-output and dual-mode control circuit 110 to divide and supply the current supplied from the switching amplification stage 140 to the main amplification stage 130 and the auxiliary amplification stage 120 by the respective switching operations of the first and second transistors $M_{N.M}$ and $M_{N.D}$. In the first mode Mode1, the linear amplification stage 150 supplies current to the main amplification stage 130, and in the second mode Mode0, the linear amplification stage 150 does not operate.

Lastly, in the first mod Mode1, the first output voltage $V_{MAIN}$, which is an envelope tracking (ET) signal, is supplied to the main amplification stage 130, and the second output voltage $V_{DRV}$, which is an average power tracking (APT) signal, is supplied to the auxiliary amplification stage 120. In the second mode Mode0, the first and second output voltages $V_{MAIN}$ and $V_{DRV}$, which are two average power tracking (APT) signals, are respectively supplied to the main amplification stage 130 and the auxiliary amplification stage 120.

In the existing envelope tracking supply modulator 11, as shown in FIG. 1, the switching amplification stage 20 supplies constant current, and the linear amplification stage 18 supplies current in a region where the envelope is large and sends current out to the ground in a region where the envelope is small, thereby producing an envelope signal. On the other hand, the dual-output and dual-mode supply modulator 102 of the present invention turns on the fourth transistor $M_{N.M}$ in a region where the envelope is large ($V_{ENV}$>$V_{TH}$) so that both the switching amplification stage 140 and the linear amplification stage 150 supply current to the main amplification stage, and turns on the third transistor $M_{N.D}$ in a region where the envelope is small ($V_{ENV}$<$V_{TH}$) so that the switching amplification 140 supplies current to the auxiliary amplification stage 120 and the linear amplification stage 150 supplies all the current the main amplification stage 130 needs. This way, the existing envelope tracking supply modulator 11 operates in such a way that, if the envelope is small, the current that needs to be sent out from the main amplification stage 130 is supplied to the auxiliary amplification stage 120. Therefore, an average power tracking (APT) signal for the auxiliary amplification stage 120 may be produced without additional power consumption.

Figure 7:
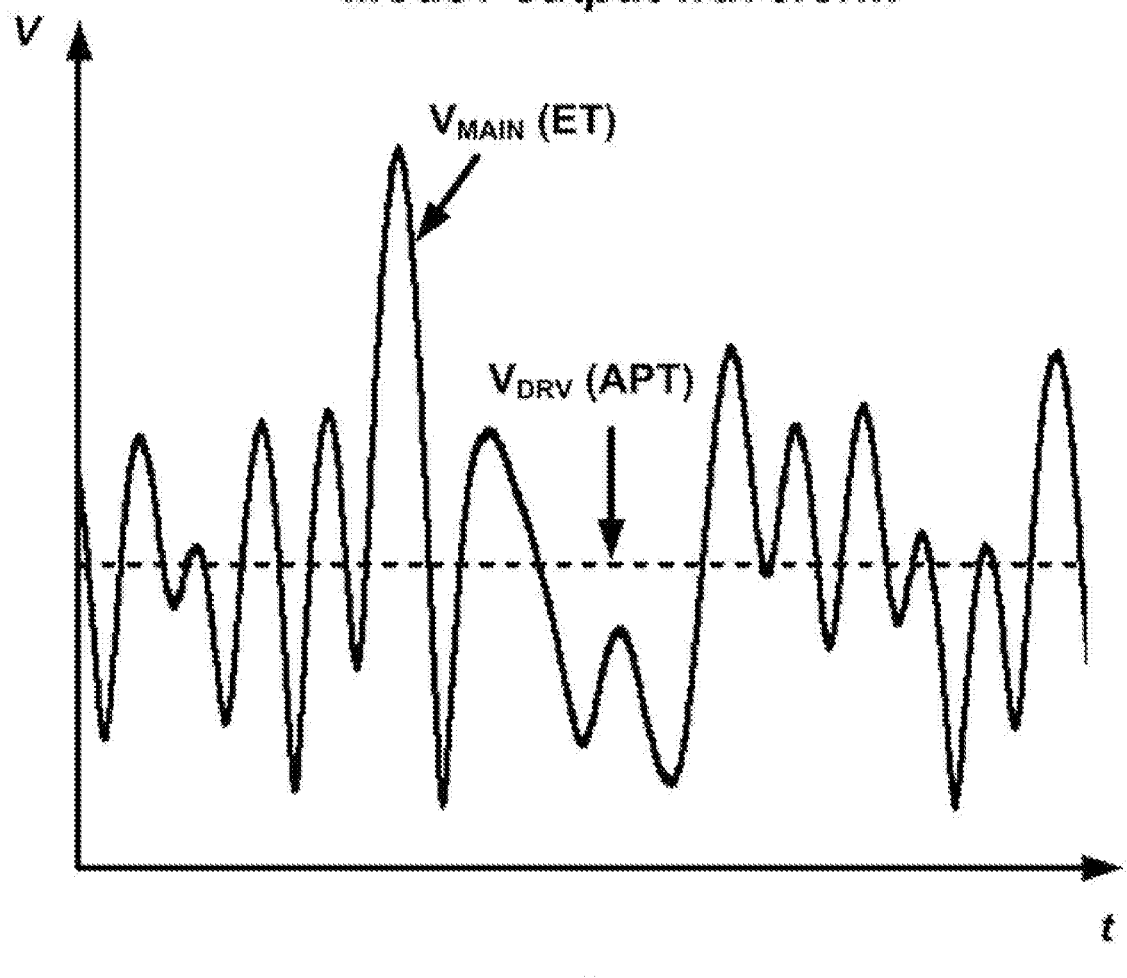
FIGS. 7 and 8 are waveform diagrams showing output states of the first and second modes shown in FIG. 2.
Figure 8:
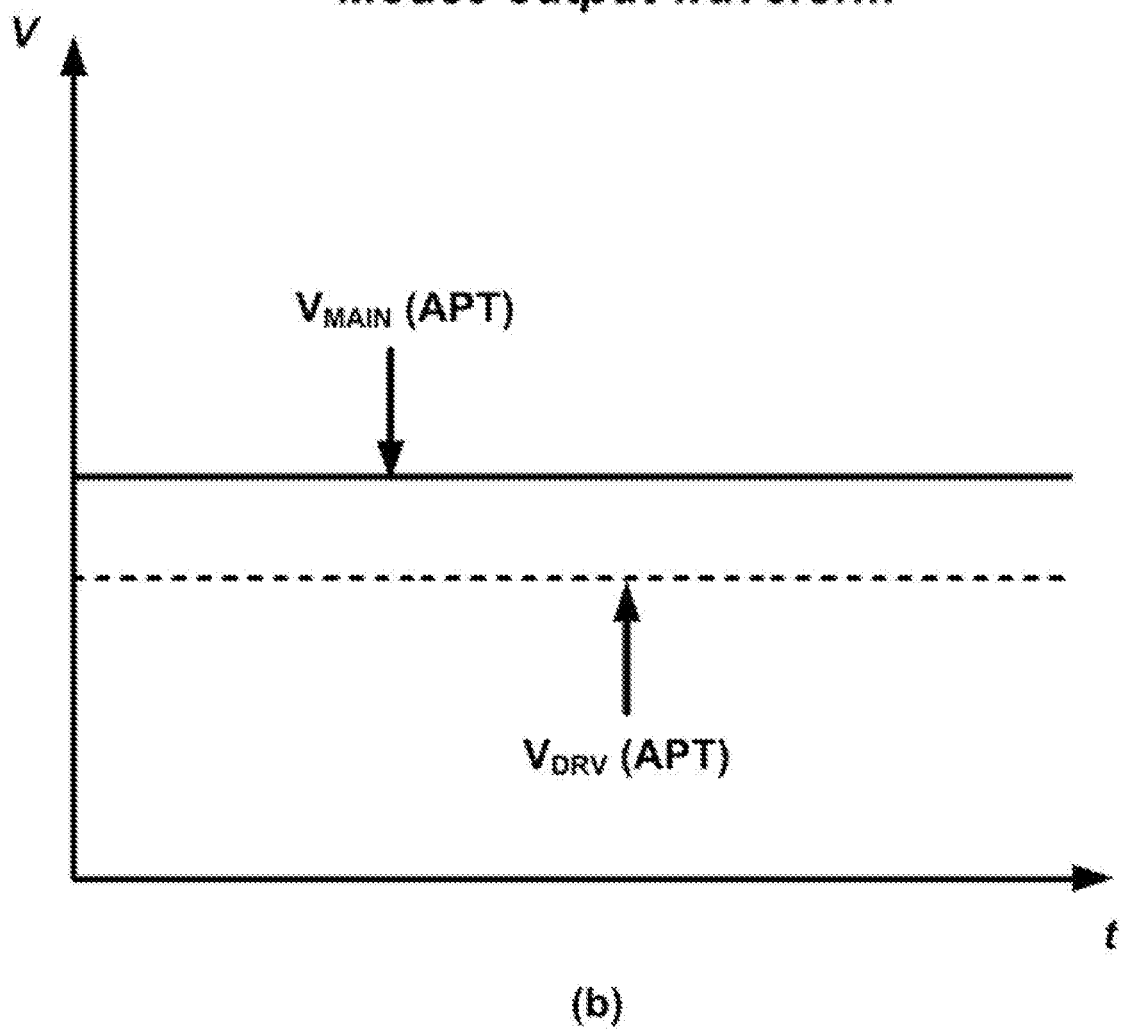

FIGS. 7 and 8 are waveform diagrams showing output states of the first and second modes shown in FIG. 2.

Referring to FIGS. 7 and 8, in the first mode Mode1, the dual-output and dual-mode supply modulator 102 outputs one envelope voltage and one DC voltage. The envelope voltage is determined by an input envelope voltage, and the DC voltage is determined by an input DC reference voltage. The envelope voltage is supplied to the main amplification stage 130 for envelope tracking supply modulation, and the DC voltage is supplied to the auxiliary amplification stage 120 for average power tracking supply modulation.

In the second mode Mode0, the dual-output and dual-mode supply modulator 102 outputs two DC voltages. The two DC voltages are respectively determined by two input DC reference voltages. The two DC voltages are respectively supplied to the main amplification stage 130 and the auxiliary amplification stage 120 for their respective average power tracking supply modulations.

Figure 9:
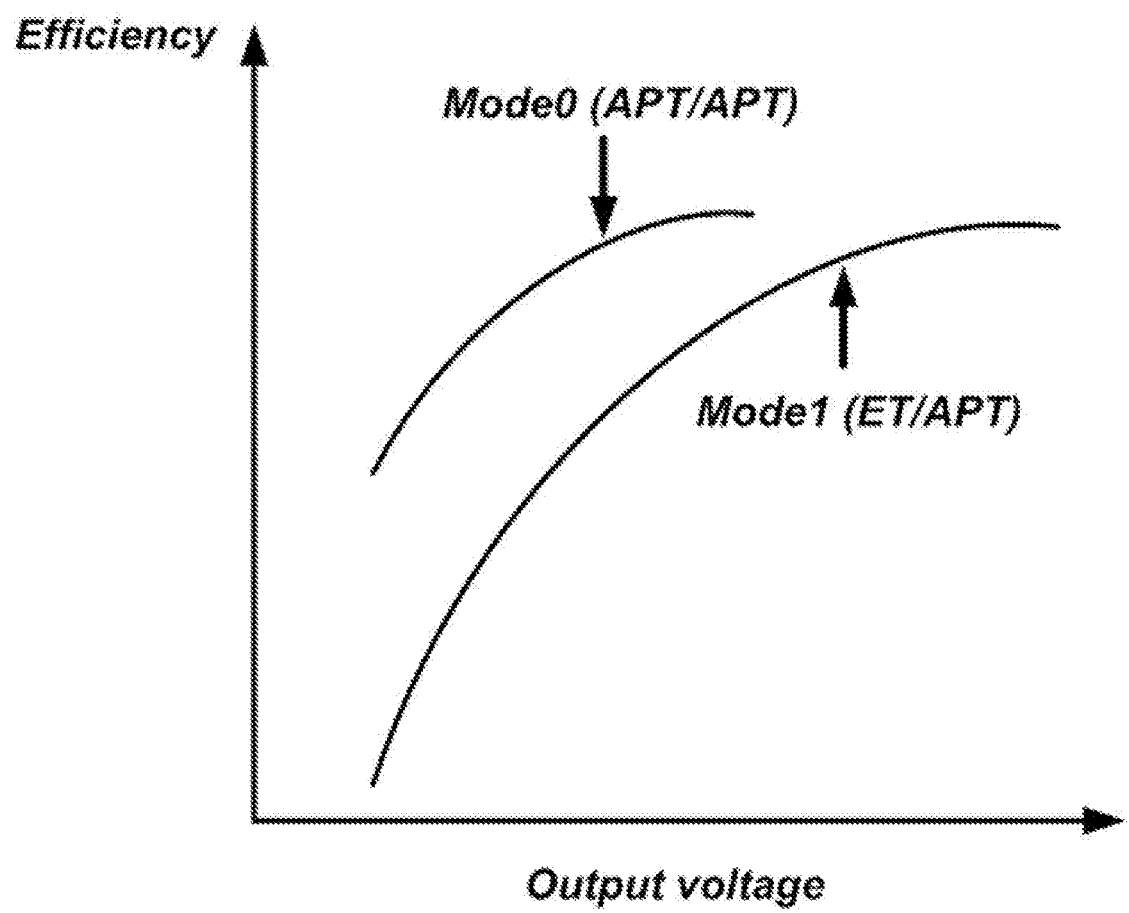
FIG. 9 is a waveform diagram showing the efficiency achieved by output voltages for the first and second modes shown in FIGS. 7 and 8.

FIG. 9 is a waveform diagram showing the efficiency achieved by output voltages for the first and second modes shown in FIGS. 7 and 8.

Referring to FIG. 9, this waveform diagram shows variations in efficiency in different modes of the dual-output and dual-mode supply modulator 102. An envelope output operation in the first mode Mode1 may bring a significant improvement in the efficiency of the main amplification stage 130; however, the efficiency of the linear amplification stage 150 of the supply modulator 102 decreases with decreasing supply voltage, thus leading to a sharp drop in the overall efficiency of the supply modulator 102. By contrast, a DC output operation in the second mode Mode0 may bring a relatively small improvement in the efficiency of the main amplification stage 130, but the efficiency of the supply modulator 102 does not decrease much even with decreasing supply voltage.

Therefore, when the output voltage of the two-stage power amplifier 100 is high, the supply modulator 102 is operated in the first mode Mode1 to improve the efficiency of the two-stage power amplifier 100, and when the output voltage of the two-stage power amplifier 100 is low, the supply modulator 102 is operated in the second mode Mode0 to increase the efficiency of the supply modulator 102. As such, the efficiency of the two-stage power amplifier 100 whose supply is modulated may be improved in both high and low power regions.

The embodiments described in the present specification and the attached drawings are merely illustrative to describe a part of the technical spirit included in the present invention. Accordingly, the embodiments disclosed in the present specification are intended not to limit but to describe the technical spirit of the present invention. Thus, it is apparent that the scope of the technical spirit of the present invention is not limited by this embodiment. It should be interpreted that other modifications and specific embodiments which those with ordinary knowledge in the art can easily infer within the scope of the technical spirit included in the specification and drawings of the present invention also fall within the technical scope of the present invention.

What is claimed is:

1. A dual-output and dual-mode supply modulator comprising:
 a dual-output and dual-mode control circuit configured to receive first to fourth reference voltages and a mode signal to select one of a first mode and a second mode, and output one envelope tracking signal and one average power tracking signal in response to a selection of the first mode, and output two average power tracking signals in response to a selection of the second mode;
 a switching amplification stage that is controlled by the dual-output and dual mode control circuit to regulate amounts of current in the envelope tracking signal and the average power tracking signal outputted in the first mode or the second mode;
 a linear amplification stage that receives the first reference voltage and supplies current to the envelope tracking signal so that an output voltage of the envelope tracking signal tracks the first reference voltage in the first mode; and
 a switching circuit that is controlled by the dual-output and dual-mode control circuit and performs switching to output the one envelope tracking signal and the one average power tracking signal in the first mode, or performs switching to output the two average power tracking signals in the second mode.

2. The dual-output and dual-mode supply modulator of claim 1, wherein the dual-output and dual-mode control circuit further comprises:
 a first mode control block that outputs a first mode control signal that controls the supply modulator to operate in the first mode;
 a second mode control block that outputs a second mode control signal that controls the supply modulator to operate in the second mode; and
 a mode selection block that selectively outputs the first mode control signal or the second mode control signal in response to the mode signal.

3. The dual-output and dual-mode supply modulator of claim 1, wherein the switching circuit comprises a first switching element and a second switching element,
 wherein the first switching element is configured to perform switching to output the one average power tracking signal in the first mode and output a first of the two average power tracking signals in the second mode, and the second switching element is configured to perform switching to output the one envelope tracking signal in the first mode and a second of the two average power tracking signals in the second mode.

4. The dual-output and dual-mode supply modulator of claim 1, wherein:
 the supply modulator is configured to operate in the first mode in a first output power region of a two-stage power amplifier comprising a main amplification stage and an auxiliary amplification stage to supply the one envelope tracking signal to the main amplification stage and supply the one average power tracking signal to the auxiliary amplification stage, and
 the supply modulator is configured to operate in the second mode in a second output power region of the two-stage power amplifier which is lower than the first output power region to supply the two average power tracking signals respectively to the main amplification stage and the auxiliary amplification stage.

5. A two-stage power amplifier comprising:
 a main amplification stage provided between an input node and an output node;
 an auxiliary amplification stage provided between the input node and the main amplification stage, and connected in series with the main amplification stage; and
 a dual-output and dual-mode supply modulator configured to operate in a first mode or a second mode in response to receipt of a plurality of reference voltages and receipt of a mode signal to select an operation mode, and configured to output an envelope tracking signal to the main amplification stage and output an average power tracking signal to the auxiliary amplification stage in the first mode, and configured to output two average power tracking signals respectively to the main amplification stage and the auxiliary amplification stage.

6. The two-stage power amplifier of claim 5, wherein the dual-output and dual-mode supply modulator further comprises:
 a dual-output and dual-mode control circuit configured to receive the plurality of reference voltages and receive the mode signal to select one of the first mode and the second mode, and in an operation in the first mode, supply a first output voltage to the main amplification stage based on an envelope tracking signal, and supply a second output voltage to the auxiliary amplification stage based on an average power tracking signal and, in an operation in the second mode, supply the first output voltage and the second output voltage respectively to the main amplification stage and the auxiliary amplification stage based on two average power tracking signals;
 a switching amplification stage that is controlled by the dual-output and dual mode control circuit to regulate amounts of current supplied respectively to the main amplification stage and the auxiliary amplification stage;
 a linear amplification stage that receives a first reference voltage of the plurality of reference voltages and supplies current to the main amplification stage so that the first output voltage supplied to the main amplification stage tracks the first reference voltage; and
 a switching circuit that is controlled by the dual-output and dual-mode control circuit and performs switching to supply the first output voltage to the main amplification stage and supply the second output voltage to the auxiliary amplification stage.

7. The two-stage power amplifier of claim 6, wherein the dual-output and dual-mode control circuit further comprises:
 a first mode control block that receives the first reference voltage, a second reference voltage of the plurality of reference voltages, and a fourth reference voltage of the plurality of reference voltages, and outputs a first mode control signal to control the supply modulator to operate in the first mode;

a second mode control block that receives a third reference voltage of the plurality of reference voltages and the fourth reference voltage, and outputs a second mode control signal to control the supply modulator to operate in the second mode; and a mode selection block that selectively outputs the first mode control signal and the second mode control signal in response to the mode signal.

8. The two-stage power amplifier of claim 6, wherein the switching amplification stage comprises a first switching element and a second switching element, and the switching amplification stage is controlled by the dual-output and dual-mode control circuit to receive an output voltage of a low level and switch on the first switching element and switch off the second switching element to increase an amount of current supply, or to receive an output voltage of a high level and switch off the first switching element and switch on the second switching element to decrease the amount of current supply.

9. The two-stage power amplifier of claim 8, wherein the switching circuit further comprises a third switching element and a fourth switching element, wherein the third switching element performs switching to supply or cut off current from the switching amplification stage to the auxiliary amplification stage, and the fourth switching element performs switching to supply or cut off the current from the switching amplification stage to the main amplification stage.

10. The two-stage power amplifier of claim 6, wherein the linear amplification stage operates in the first mode to supply current to the main amplification stage so that the first output voltage tracks the first reference voltage.

11. The two-stage power amplifier of claim 10, wherein the supply modulator further comprises a transmission gate switch configured to disconnect the first output voltage from the main amplification stage in the first mode when the linear amplification stage turns on, and configured to connect the first output voltage to the main amplification stage in the second mode when the linear amplification stage turns off.

12. The two-stage power amplifier of claim 5, wherein the supply modulator is configured to operate in the first mode in a first output power region of the two-stage power amplifier to supply the envelope tracking signal to the main amplification stage and supply the one average power tracking signal to the auxiliary amplification stage, and the supply modulator is configured to operate in the second mode in a second output power region of the two-stage power amplifier which is lower than the first output power region to supply the two average power tracking signals respectively to the main amplification stage and the auxiliary amplification stage.

13. A supply modulation method for a two-stage power amplifier, the method comprising:

receiving first to fourth reference voltages and receiving a mode signal that controls a supply modulator of the two-stage power amplifier to operate in a first mode when the two-stage power amplifier operates in a first output power region, and control the supply modulator to operate in a second mode when the two-stage power amplifier operates in a second output power region which is lower than the first output power region;

comparing the first reference voltage and the second reference voltage when the supply modulator operates in the first mode;

turning on a first transistor of a switching amplification stage of the supply modulator to increase an amount of current supply and turning on a fourth transistor of a switching circuit of the supply modulator to supply current to a main amplification stage when the first reference voltage is in a higher region than the second reference voltage;

comparing a second output voltage supplied to an auxiliary amplification stage and the fourth reference voltage when the first reference voltage is in a lower region than the second reference voltage, and, when the second output voltage is in the lower region than the fourth reference voltage, turning on the first transistor of the switching amplification stage to increase the amount of current supply and turning on a third transistor of the switching circuit to supply current to the auxiliary amplification stage; and turning on a second transistor of the switching amplification stage to decrease the amount of current supply and turning on the fourth transistor of the switching circuit to supply current to the main amplification stage when the second output voltage is in a higher region than the fourth reference voltage.

14. The supply modulation method of claim 13, further comprising:

comparing the second output voltage and the fourth reference voltage when the supply modulator operates in the second mode, and, turning on the first transistor of the switching amplification stage to increase the amount of current supply and turning on the third transistor of the switching circuit to supply current to the auxiliary amplification stage when the second output voltage is in the higher region than the fourth reference voltage; and if the second output voltage is in a lower region than the fourth reference voltage, comparing the first output voltage and the third reference voltage when the second output voltage is in the higher region than the fourth reference voltage; and, turning on the first transistor of the switching amplification stage to increase the amount of current supply and turning on the fourth transistor of the switching circuit to supply current to the main amplification stage when the first output voltage is in a lower region than the third reference voltage.

15. The supply modulation method of claim 14, further comprising:

turning on the second transistor of the switching amplification stage to decrease the amount of current supply and turning on the fourth transistor of the switching circuit to supply remaining current to the main amplification stage when the first output voltage is in a higher region than the third reference voltage.

16. The supply modulation method of claim 13, wherein, in the first output power region of the two-stage power amplifier, the supply modulator operates in the first mode to supply one envelope tracking signal to the main amplification stage and supply one average power tracking signal to the auxiliary amplification stage, and, in the second output power region, the supply modulator operates in the second mode to supply two average power tracking signals respectively to the main amplification stage and the auxiliary amplification stage.

* * * * *